United States Patent
Adkins, Jr. et al.

(10) Patent No.: US 12,000,872 B2
(45) Date of Patent: Jun. 4, 2024

(54) COMPACT TEST POINT DEVICE

(71) Applicant: Grace Technologies, Inc., Davenport, IA (US)

(72) Inventors: Charles Ronald Adkins, Jr., Newell, WV (US); Roger Steven Clarke, Newell, WV (US); Gang Chen, Newell, WV (US)

(73) Assignee: GRACE TECHNOLOGIES, INC., Davenport, IA (US)

( * ) Notice: Subject to any disclaimer, the term of this patent is extended or adjusted under 35 U.S.C. 154(b) by 195 days.

(21) Appl. No.: 17/451,000

(22) Filed: Oct. 15, 2021

(65) Prior Publication Data

US 2022/0120791 A1    Apr. 21, 2022

Related U.S. Application Data

(60) Provisional application No. 63/198,389, filed on Oct. 15, 2020.

(51) Int. Cl.
| | | |
|---|---|---|
| *G01R 19/155* | (2006.01) | |
| *H01R 13/52* | (2006.01) | |
| *H01R 13/717* | (2006.01) | |
| *H01R 13/74* | (2006.01) | |

(52) U.S. Cl.
CPC ....... *G01R 19/155* (2013.01); *H01R 13/5202* (2013.01); *H01R 13/5213* (2013.01); *H01R 13/7175* (2013.01); *H01R 13/746* (2013.01)

(58) Field of Classification Search
CPC .... G01R 19/00; G01R 19/145; G01R 19/155; G01R 19/165; H01R 13/00; H01R 13/46; H01R 13/52; H01R 13/5213; H01R 13/66; H01R 13/717; H01R 13/7175; H01R 13/73; H01R 13/74; H01R 13/746
USPC .............................................. 324/76.11, 133
See application file for complete search history.

(56) References Cited

U.S. PATENT DOCUMENTS

| | | | | |
|---|---|---|---|---|
| 3,962,630 A | * | 6/1976 | Chaffee ................. | G01R 31/54 324/508 |
| 4,151,363 A | * | 4/1979 | Nichols ................. | H02G 3/065 174/669 |
| 5,739,692 A | * | 4/1998 | Subda, Jr. ............. | C25D 13/22 205/474 |

(Continued)

FOREIGN PATENT DOCUMENTS

| | | | | | |
|---|---|---|---|---|---|
| CN | 204855658 U | * | 12/2015 | ............. | G01R 31/02 |
| CN | 206990773 U | * | 2/2018 | ............. | G01R 31/40 |
| CN | 209070364 U | * | 7/2019 | ............. | G05B 23/02 |

*Primary Examiner* — Hoai-An D. Nguyen
(74) *Attorney, Agent, or Firm* — Goodhue, Coleman & Owens, P.C.

(57) ABSTRACT

In order to provide an environmentally secured voltage testing interface, an electrical enclosure box comprising a front panel is herein-described, into which is mounted a voltage indicator comprising a plurality of LED indicators that indicate a status of one or more circuits coupled thereto and monitored thereby. A compact test point device is also mounted through the front panel and comprises an interface comprising a plurality of external measurement sockets configured to receive one or more probes for manual measurement of voltages, wherein each external measurement socket is coupled to a voltage divider that is further coupled to each of a plurality of respective wires coupled to respective LED indicators.

20 Claims, 15 Drawing Sheets

(56) References Cited

U.S. PATENT DOCUMENTS

| | | | |
|---|---|---|---|
| 7,893,686 B1* | 2/2011 | Atherton | G01R 19/155 |
| | | | 324/133 |
| 11,709,208 B2* | 7/2023 | Adkins, Jr. | G01R 1/067 |
| | | | 324/509 |
| 2006/0096775 A1* | 5/2006 | Noest | H02G 3/14 |
| | | | 174/67 |
| 2019/0178919 A1* | 6/2019 | Magno | G08B 25/10 |
| 2020/0062125 A1* | 2/2020 | Brauner | H02J 7/0063 |

* cited by examiner

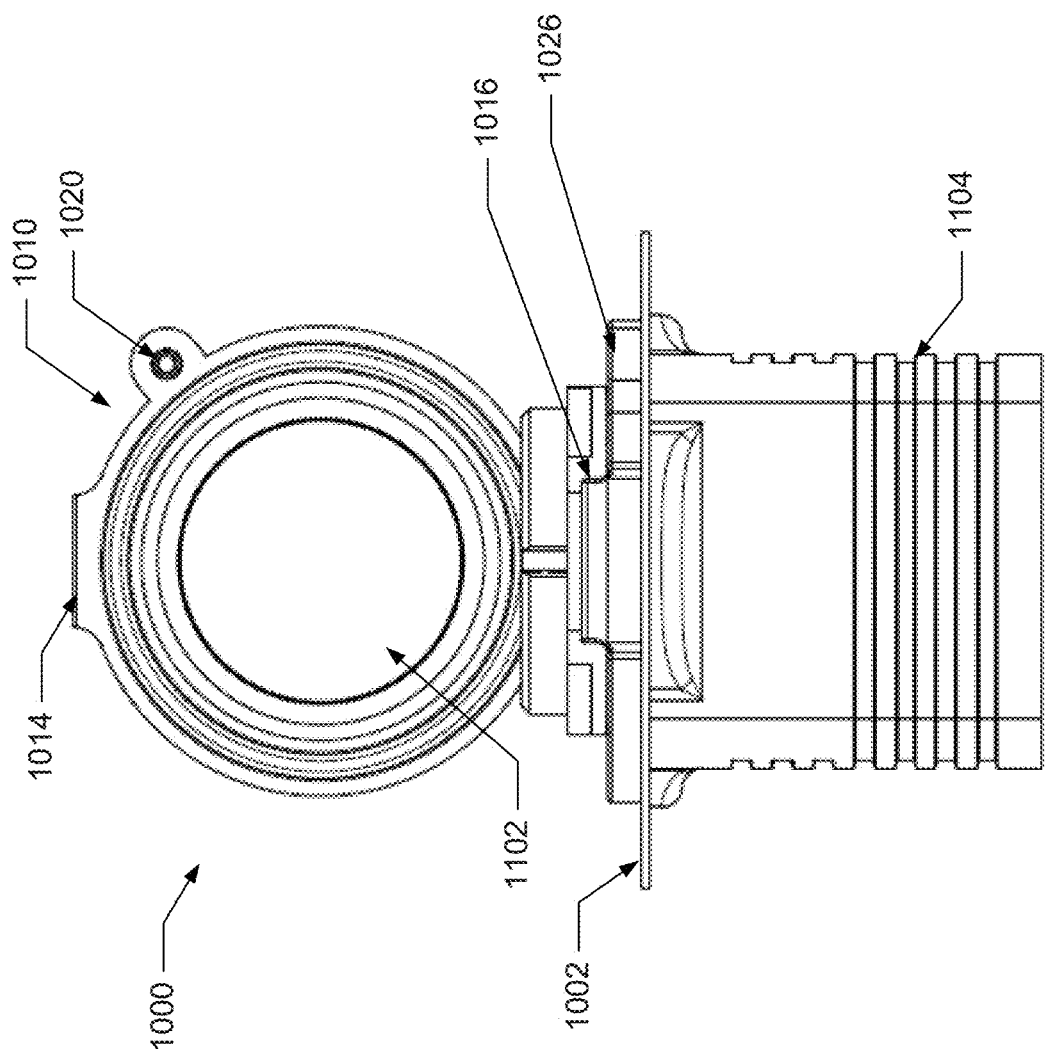

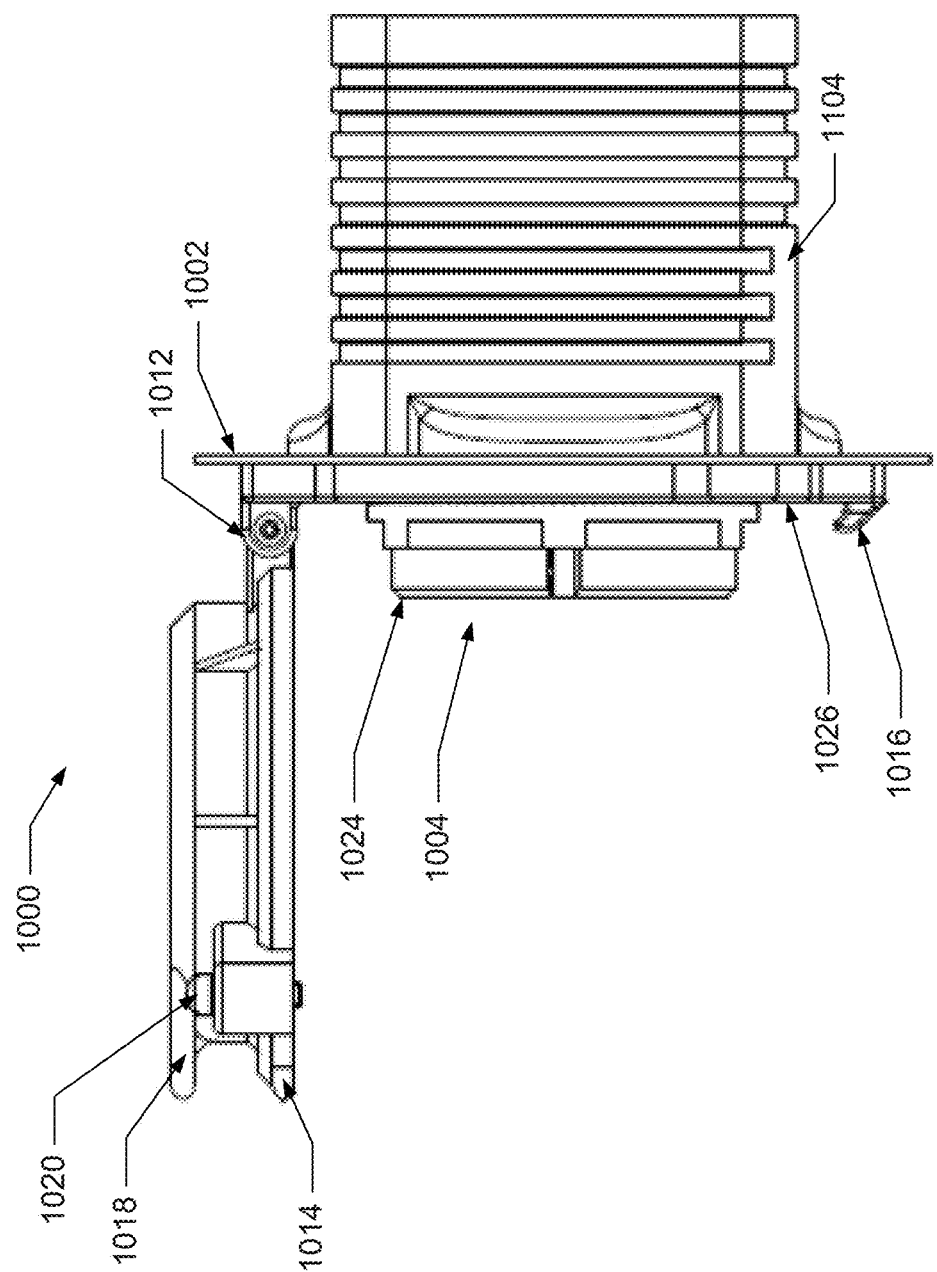

COMPACT TEST POINT DEVICE

This application claims the priority benefit of U.S. Provisional Patent Application No. 63/198,389 filed Oct. 15, 2020 and titled "COMPACT TEST POINT DEVICE," which is incorporated by reference in its entirety.

BACKGROUND

The following relates to the electrical power arts. It particularly relates to monitoring a safe electrical disconnection of a high voltage circuit for servicing, and will be described with particular reference thereto. However, the following will also find application in routine monitoring of electrical line voltages and in other aspects of electrical safety.

To verify electrical isolation, electrical safety monitors which monitor electrical energy potentials of monitored electrical lines of an electrical panel are utilized. The electrical safety monitors provide a warning with light emitting diode ("LED") indicators in response to an electrical potential being present on the monitored lines. During servicing, electricians verify normal operation of the indicators while the panel is powered and then verify all of the indicators are extinguished while the panel is powered down before opening the panel. Although electrical safety monitors have proven to be reliable, final verification by lack of illumination provides less assurance than desired due to the possibility of circuit failure or malfunction which could likewise be the culprit for extinguished indicators and not just the absence of voltage on the monitored lines.

Additionally, although the operating current required for indication is extremely low, typically less than 1 milliampere at 750 VAC 3-phase, the electrical safety monitors are often rated for 750 VAC continuous operation or more, and the monitored line voltages entering the monitor are at full 3-phase line voltage potentials. To further electrically isolate the electrical safety monitors due to the high energy potential during operation, the housing of these monitors are typically non-conductive and the electronics are fully encapsulated in a high quality thermoset potting compound. It is desired to have the electrical safety monitor include a separate internally mounted electrical package and display adaptor mounted in the panel to provide an indication when an electrical potential is present on the monitored lines.

The following description contemplates an improved approach that overcomes the aforementioned limitations and others.

SUMMARY

The subject innovation relates to a compact test point device that incorporates a power alert device while utilizing a novel configuration of internal resistors, diodes, MOSFETs, etc., that provide a safe or safer non-shock level measurement via a measurement interface outside an electrical enclosure or housing. The device uses a safety circuit comprising multiple series resistors and additional diodes, capacitors and other electrical components that connect to a voltage source to be measured, and also connect to a voltage measurement terminal that connects to a smaller value resistor that is coupled to a common connection point inside the device. With each measurement point being connecting this way, the hazardous voltage accessible on an electrical enclosure box is limited to a safe or safer level (e.g., 0.001-100 V or the like). In another embodiment, an approximately 1:1 voltage pass-through ratio is provided while also limiting current pass-through. This embodiment may include the common connection point, or may have separate connection points. The voltage to be measured at a measurement interface is reduced by a sufficient factor of (e.g., 10, 100, 1000) at the measurement terminals. In one embodiment, the device employs resistance to limit the current inside the electrical box to a safe or safer non-shocking level at the measurement terminal on the outside of the electrical enclosure box. In another embodiment, the device is configured to turn off certain MOSFETs in order to supplant the large current limiting resistors to reduce the maximum voltage loss percentage to the measurement sockets yet sharply limiting current to a relatively low maximum level at elevated voltages.

According to one aspect, a system that facilitates providing an environmentally secured voltage testing interface comprises a compact test point device that is mounted to a front panel of an electrical enclosure box and comprises an interface comprising a plurality of external measurement sockets configured to receive one or more probes for manual measurement of voltages and a plurality of LED indicators that indicate a status of one or more circuits coupled thereto and monitored thereby, wherein each external measurement socket is coupled to a voltage divider that is further coupled to each of a plurality of respective wires coupled to respective LED indicators.

According to another aspect, system that facilitates providing an environmentally secured voltage testing interface comprises a compact test point device that is mounted to a front panel of an electrical enclosure box and comprises an interface comprising a plurality of external measurement sockets configured to receive one or more probes for manual measurement of voltages and a plurality of LED indicators that indicate a status of one or more circuits coupled thereto and monitored thereby. Each external measurement socket is coupled to a voltage divider that is further coupled to each of a plurality of respective wires coupled to respective LED indicators. The system also comprises a front protection cover that protects the external measurement sockets from the environment.

BRIEF DESCRIPTION OF THE DRAWINGS

FIG. 14 illustrates a bottom view of the compact test point device, which is coupled to the front plate of an electrical enclosure, in accordance with various features described herein.

FIG. 15 illustrates a side view of the compact test point device, which is coupled to the front plate of an electrical enclosure, in accordance with various features described herein.

DETAILED DESCRIPTION

The problem to be solved relates to how to safely monitor and measure voltage outside of electrical enclosures while maintaining a voltage level that is below a shock hazard level. Some conventional devices allow for the measurement of voltage on the outside the electrical enclosures. However, such devices leave a hazardous voltage level at the measurement interface outside of the panel. These type of devices use a single series resistor for each phase that connects to measurement interface outside of the electrical enclosure box. Conventional devices leave the full voltage potential inside the electrical enclosure box at the measurement interface measurement points on the outside of the box. The conventional arrangement of the single resistor connected in series allows for a slightly safer voltage measurement by limiting the current to a lower level, but still maintains the potential for shock level hazardous voltage at the measurement interface on the outside of the electrical enclosure.

To solve this problem the described compact test point device incorporates a power alert device while utilizing a novel configuration of internal resistors that provides a safer "non-shock" level measurement via a measurement interface outside the electrical enclosure. The device uses multiple series resistors that connect to a voltage source to be measured, and also connect to a voltage measurement terminal that connects to a smaller value resistor that is coupled to a common connection point inside the device. With each measurement point being connecting this way, the hazardous voltage accessible on an electrical enclosure box is limited to a safe or safer level (e.g., 1-100 Volts). The voltage to be measured at the measurement interface is reduced by a sufficient factor of (e.g., 10, 100, 1000) at the measurement terminals. E.g., in a case where 1000V is applied within the electrical enclosure, the voltage can be stepped down to 1V at the measurement terminals on the measurement interface outside of the measurement box. The device employs enough resistance to limit the current inside the electrical box to a safe non-shocking level at the measurement terminal on the outside of the electrical enclosure box.

Figure 1:
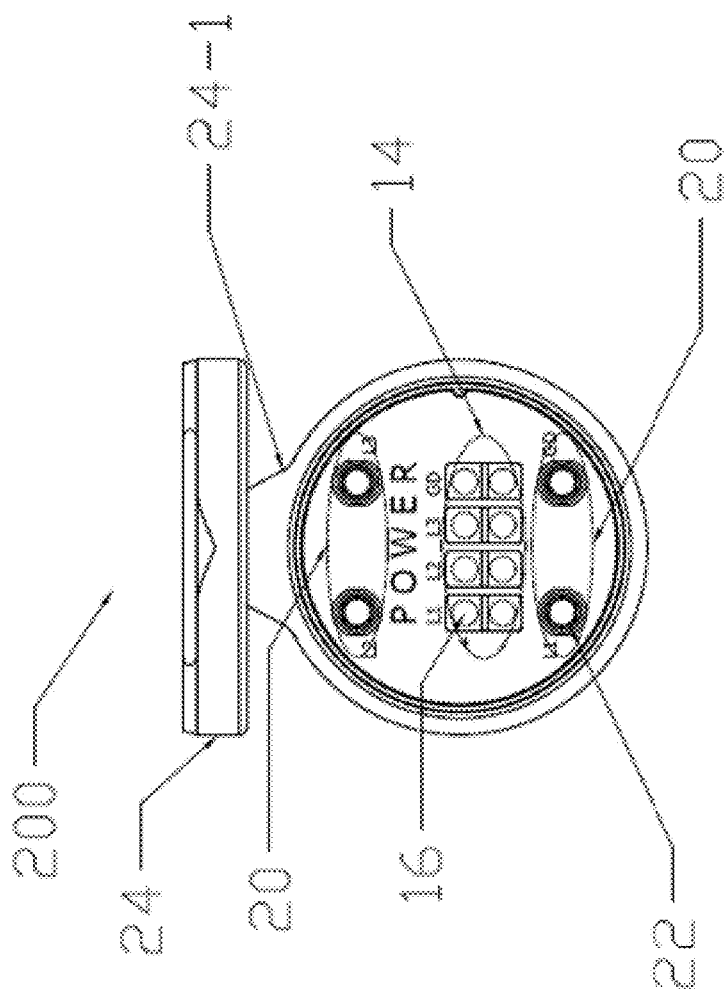
FIG. 1 illustrates a front view of a compact test point device that facilitates providing an environmentally secured voltage testing interface, in accordance with one or more aspects described herein.

FIG. 1 illustrates an environmentally secured voltage testing interface 20, in accordance with one or more aspects described herein. The described system comprises a front plate or panel (not shown) of an electrical enclosure box (not shown) into which is mounted the compact test point device 200 (e.g., a voltage detection indicator circuit such as may be similar to those described in U.S. Pat. Nos. 6,703,938 and 9,013,296, which are hereby incorporated by reference in their entireties herein) comprising a plurality of LED indicators 16 (shown as squares on the voltage indicator region 14) that indicate a status of one or more circuits coupled thereto and monitored thereby. The interface 20 comprises a plurality of external measurement sockets 22 configured to receive one or more testing probes (e.g., multimeter testing probes, probes for testing voltage, current resistance, capacitance, impedance, or any other circuit-testable parameters, etc.) for manual or automated measurement of voltages. There is provided a front protection cover 24 (e.g., a cap or the like) that keeps the compact test point connection measurement sockets 22 protected from the environment when testing is not being performed. In one embodiment, the front protection cover is attached to the front plate (not shown) with a flexible hinge 24-1 or other means that allows the front protection cover to be securely closed or securely open when needed.

Figure 2:
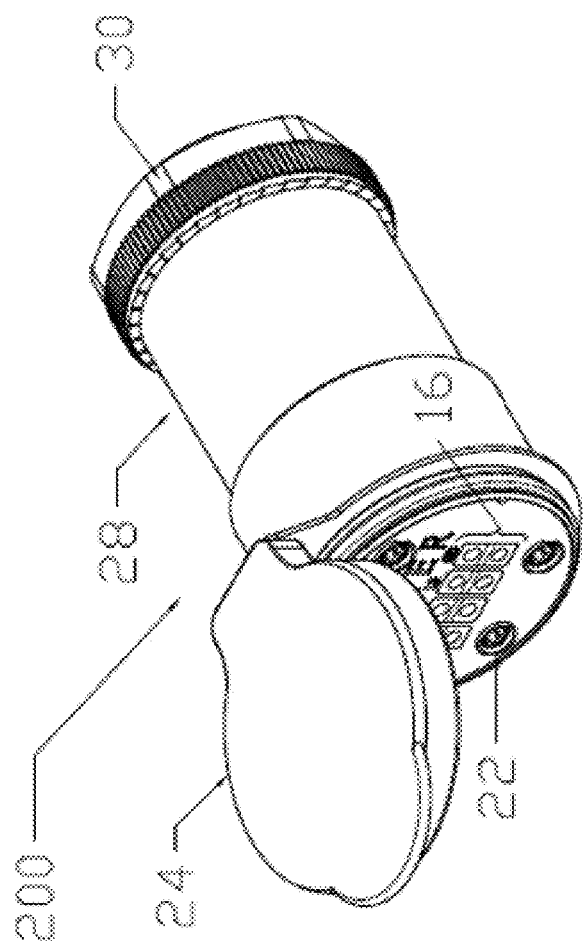
FIG. 2 illustrates a perspective view of compact test point device, in accordance with one or more features described herein.

FIG. 2 illustrates a front view of the compact test point device 200, in accordance with one or more features described herein. The illustration shows a plurality 14 of voltage indicators 16, each voltage indicator 16 being configured to indicate a status of one or more circuits coupled thereto and monitored thereby. The compact test point device 200 is mounted through a front panel (not shown) of an electrical box and comprises an interface 20 comprising a plurality of external measurement sockets 22 configured for manual measurement of voltages. The compact test point device further comprises a front protection cover 24 that keeps the test point connection measurement sockets 22 protected from the environment when testing is not being performed. It will be appreciated that although the measurement sockets 22 are depicted as being hexagonal where the probe is received, any suitable shape (e.g., circular, etc.) may be employed to accommodate any corresponding probe shape, as will be understood by one of skill in the art.

The back of the compact test point device 200 comprises resistors and wiring (not shown in FIG. 2; see FIG. 5) that extend from the back to connect wires (See FIG. 5) for the voltages to be monitored. In one embodiment, there is provided an O-ring seal (not shown in FIG. 2) that is located on a back side of the display portion (see FIG. 5) of the compact test point device and seals against a front side (See FIG. 5) of the front panel (See FIG. 5) and securely seals the test point device against the front side of the front panel. The O-ring is located in a recessed O-ring groove on the rear periphery of the display head and makes a compressive seal with the front surface of the panel. The compact test point device is secured by installing a spacing sleeve 28 that presses against the enclosure when tightening a nut 30 or other securing means on the back of the test point device.

Figure 3:
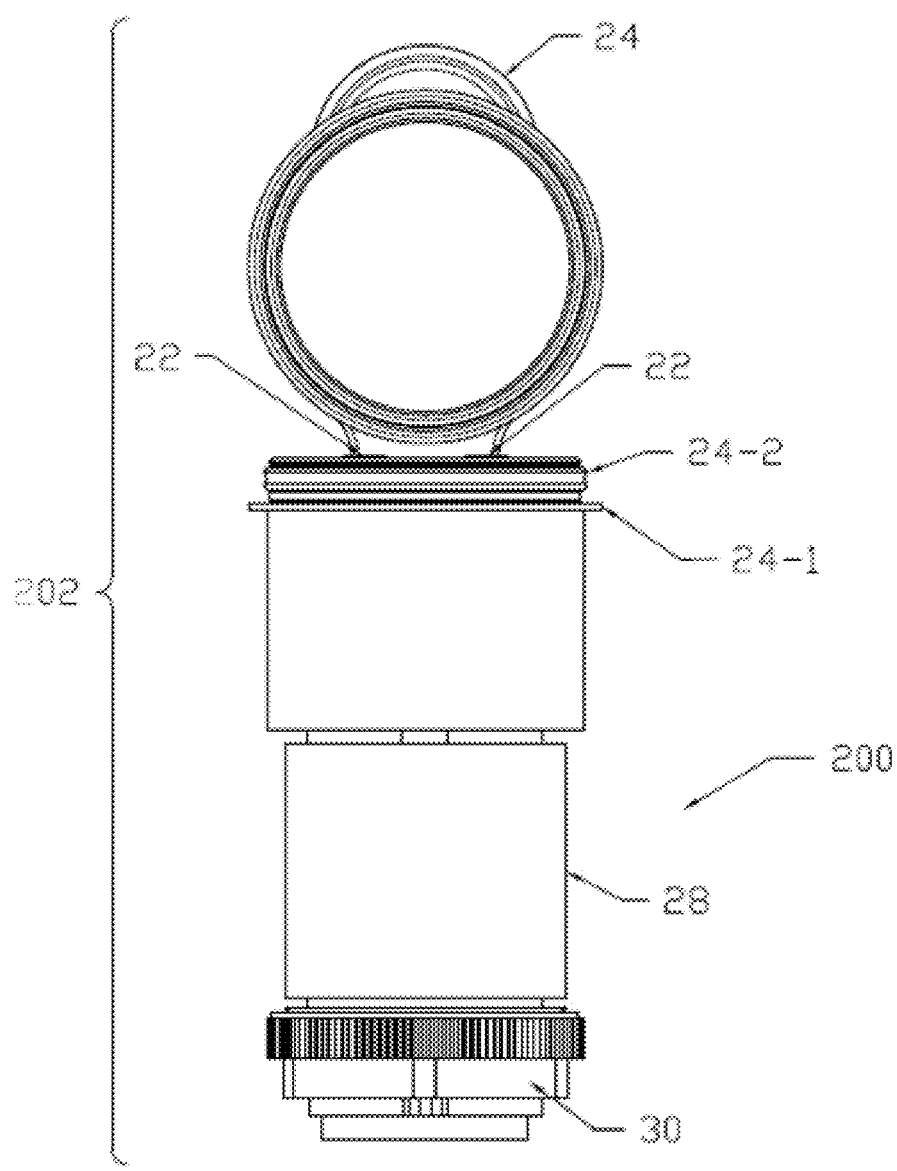
FIG. 3 illustrates a top-down view of the compact test point device, in accordance with one or more features described herein.

FIG. 3 illustrates a top-down view of the compact test point device 200, in accordance with one or more features described herein. The compact test point device 200 can be mounted to a front panel (not shown) of an electrical box (not shown). The compact test point device further comprises a front protection cover (not shown) that keeps the test point connection measurement sockets 22 protected from the environment when testing is not being performed. In one embodiment, the front protection cover is attached to the front plate of the electrical box with the hinge device 24-1 or other means that allows the front protection cover to be securely closed or securely open when needed. Also provided is a sealing member 24-2 (an O-ring or quad-ring or other suitable means) that provides a friction fitting aspect when the cover 24 is in the closed position to protect the device from the elements.

The back of the test point device 200 comprises resistors and wiring (not shown in FIG. 3) that extend to connect wires for the voltages to be monitored. There is also provided an O-ring seal (not shown) that is located on a back side of the display portion (see FIG. 5) of the compact test point device and seals against a front side (See FIG. 5) of the front panel (See FIG. 5) and securely seals the test point device against the front side of the front panel. The O-ring is located in a recessed O-ring groove on the rear periphery of the display head and makes a compressive seal with the front surface of the panel. The test point device is secured by installing a spacing sleeve 28 that presses against the inner front and back walls or panels of the enclosure when a nut 30 or other securing means is tightened against a back wall (not shown) of the test point device.

Figure 4:
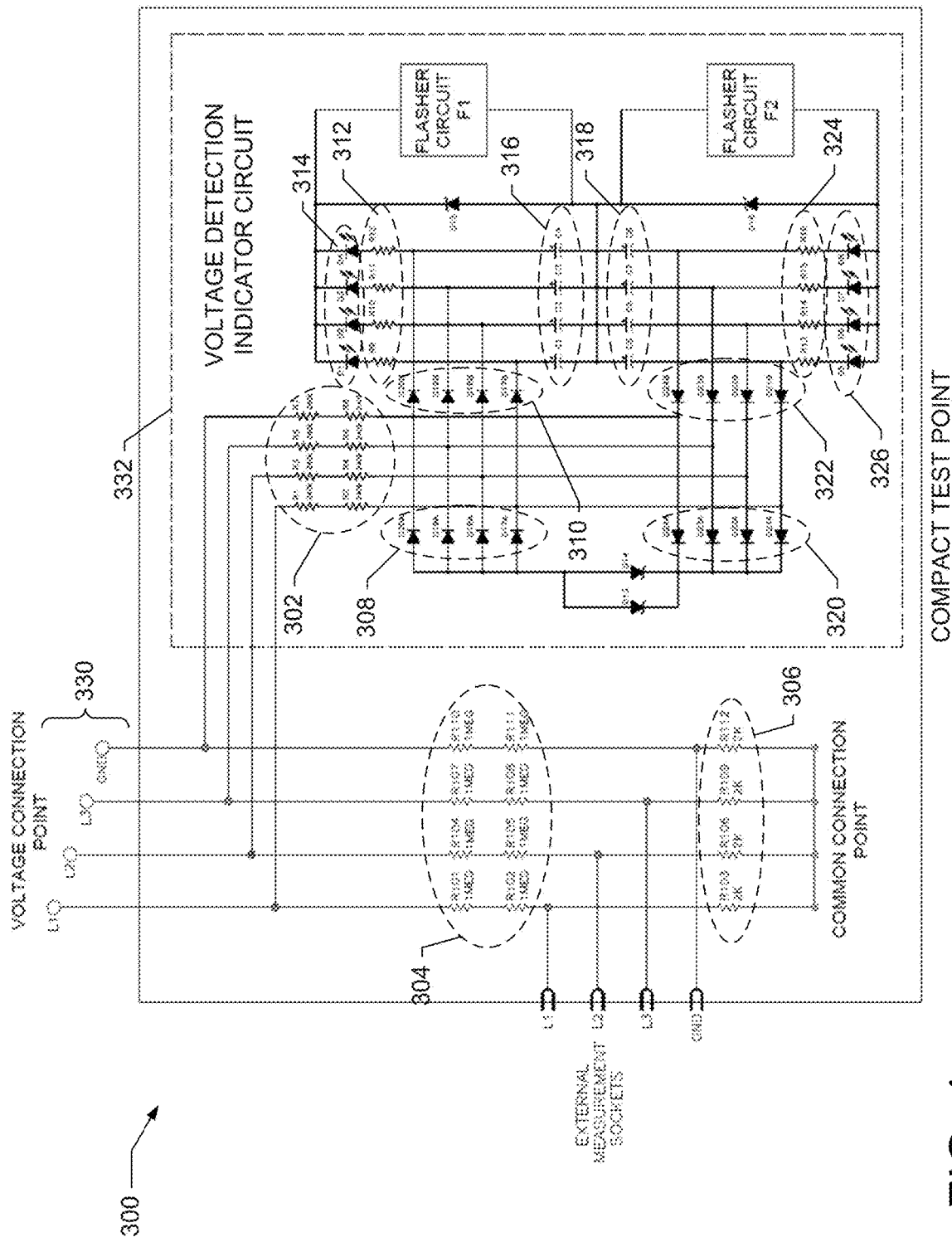
FIG. 4 shows a schematic of the safety circuitry within the test point device, in accordance with one or more features herein.

FIG. 4 shows a schematic of the safety circuitry 300 within the compact test point device 200, in accordance with one or more features herein. An example system voltage of, e.g., 1000 V can be considered, where a voltage reduction is desired to permit a technician to safely measure system voltage without being exposed to 1000V.

The safety circuit comprises a first plurality of resistors 302 (e.g., 240 k Ohm resistors or some other suitable resistance value), and a second plurality of voltage-dropping resistors 304 (e.g., 1 M ohm resistors or the like), which respectively may be arranged in series, two per line or the like, in the illustrated configuration. The voltage-dropping resistors provide a consistent voltage dropping ratio regardless of whether AC or DC voltage is passed thereacross. Additionally, a third plurality of resistors 306 is provided. The circuit 300 also comprises a first plurality of diodes 308 and a second plurality of diodes 310, arranged as shown on the respective lines. A fourth plurality of resistors 312 is provided in series with a first plurality of light-emitting diodes 314, each resistor 312 and LED 314 being provided in series on a respective line.

A first plurality of capacitors 316, one per line is shown, along with a second plurality of capacitors 318, one per line, as illustrated. A third plurality of diodes 320 is provided along with a fourth plurality of diodes 322, as illustrated. A fifth plurality of resistors 324 is provided in series with a second plurality of LEDs 326. The circuit 300 further comprises diodes D13 and D14, and Zener diodes D15 and D16, as well as Flasher circuits F1 and F2 in the arrangement shown.

Wires 330 (labeled as L1, L2, L3, and GND) from the back of the Compact Test Point device 200 connect to the wires to monitored and measured circuit features. The wires connect to the circuit 300 that further connects to two different circuit paths. The first path flows to the voltage detection indicator circuitry 332, and the second path flows to test point resistors 304, 306 and on to the external measurement sockets 22.

Power flows through the wire and branch at the 1 MEG resistors 304 and the 240K resistors 302 connection points. The 240 k series resistors 302 are current-limiting resistors for the voltage detection indicator circuitry. The 1 MEG resistors 304 start the testing point current and voltage limiting circuitry. The 1 MEG resistors divide down the voltage and reduce the current through each respective line. The external measurement sockets 22 connect after the 2nd 1 MEG resistor and 2 k Resistor 306 on each respective line. This connection point on each measured line creates a divider circuit that allows for a safe or safer voltage and current level to be accessible on the external measurement sockets 22. E.g., with 1000V applied across L1 and L2 voltage connection points, the measured voltage at the L1 and L2 external measurement sockets is 1 V. Even if the connection points were to be shorted, there would only be 0.25 mA of current accessible at the measurement sockets, thereby providing a safe or safer measurement environment for a technician testing the circuit.

For the test point (TP) measurement portion of the schematic of FIG. 4, the wire connections L1, L2, L3, and GND connect to the lines that are to be monitored externally to the device. On the inside, L1, L2, L3 and GND connect to the PCB board and each connect to R101, R104, R107 and R110 respectively, and to connection points that connect to R1, R3, R5 and R7 of the voltage detection side.

There are two different modes of operation of the schematic, mode 1 is operational when no external connections to the measurement terminals are made, and mode 2 is operational when a measurement device (e.g., a probe, multimeter, or the like) is connected to read the voltage, in which event the current path will change.

Under mode 1 of operation, when voltage is present between any two external voltage connection points of L1, L2, L3, and GND, there is a path for current to flow. For power present between L1 and L2, the power flows through resistors R101 and R102 to drop 49.95% of the total voltage. The power then flows to R103 and R106 to drop 0.1% of the voltage then out through R105 and R104 to drop remaining 49.95% of the voltage.

Under mode 2 of operation, when voltage is present between any two external voltage connection points of L1, L2, L3, and GND, there is an alternate path for current flowing through the external measurement sockets. According to an example, assuming a meter connection impedance of 10 Meg ohms power present between L1 and L2, the power flows through resistors R101 and R102 to drop 49.95% of the total voltage. Power then flows to R103 and R106 in parallel with the meter resistance to drop 0.1% of the voltage, and then out through R105 and R104 to drop remaining 49.95% of the voltage.

For the voltage detection indicator circuit, the wire connections L1, L2, L3, and GND connect to the lines that are to be monitored externally on the device. On the inside the L1, L2, L3 and GND connect to R1, R3, R5 and R7 and to a connection point that connects to R101, R104, R107 and R110 of the test point measurement point of the circuit. For a 1:1 ratio circuit, resistors 304 can be replaced with a low voltage drop bi-directional current limiting circuit.

In one embodiment, each phase connection circuit is identical, to allow for a path between any two wire connections 330 and the external measurement sockets. The illustrated example of circuit operation is given, but any two combinations can result in the same path.

The voltage detection indicator circuit operation is the same for modes 1 and 2. When power is applied to any combination for L1, L2, L3 and GND, the corresponding indicators 314, 326 (corresponding to LEDs 14, 16 of FIG. 1) will begin to illuminate. For instance, if an external AC voltage is connected between L1 and L2, then the path would be as follows: power initially flows in From L1, into R1 through a series connection to R2, to parallel connection of D17A, D17B, D21A and D21B. The current flows out through diode D17B to be partially rectified and on to a parallel connection of C1 and R9 to start charging up C1 and allow a small amount of current to flow through R9 to the series connection of D1 through the series flasher circuit F1 and flasher circuit F2 with a partial reference to common parallel connection for capacitors of C1-C8.

Current then flows through a series connection of D6 to a series connection of R14 to a parallel connection of C6 and D22B, thereby allowing C6 to charge and power to be rectified by D22B. Current then flows to the parallel connection of D22A, D18A, D18B and R4, and then flows through the series connection of R4 to the series connection of R3 and back out to L2. Once enough voltage has built up, the flashers will activate allowing for a more direct current path that allows the discharge of C1 and C6 to illuminate D1 and D6. Additionally, when current flows through D22B, the parallel connection of R4 and D22A have current flow through D22A and through the parallel connection of D13 and D14, and then through the series connection of D18A to the parallel connection of R4 and R18B to flow out R4 through R3 to L2. The reverse current path changes the L1 and L2 indicators to show the polarity direction.

In one embodiment, which is provided by way of a non-limiting example, the circuit board dimensions are approximately 2.3 inches tall by approximately 0.99 inches wide at the bottom where the wires come in and approximately 1.25 inches wide at the top were the measurement sockets connect. It will be appreciated by those of skill in the art that the foregoing dimensions are exemplary in nature and not to presented by way of limitation.

It will be appreciated that all electrical component values (resistance impedance, capacitance, etc.) described herein are illustrative in nature and not to be construed in a limiting sense.

Figure 5:
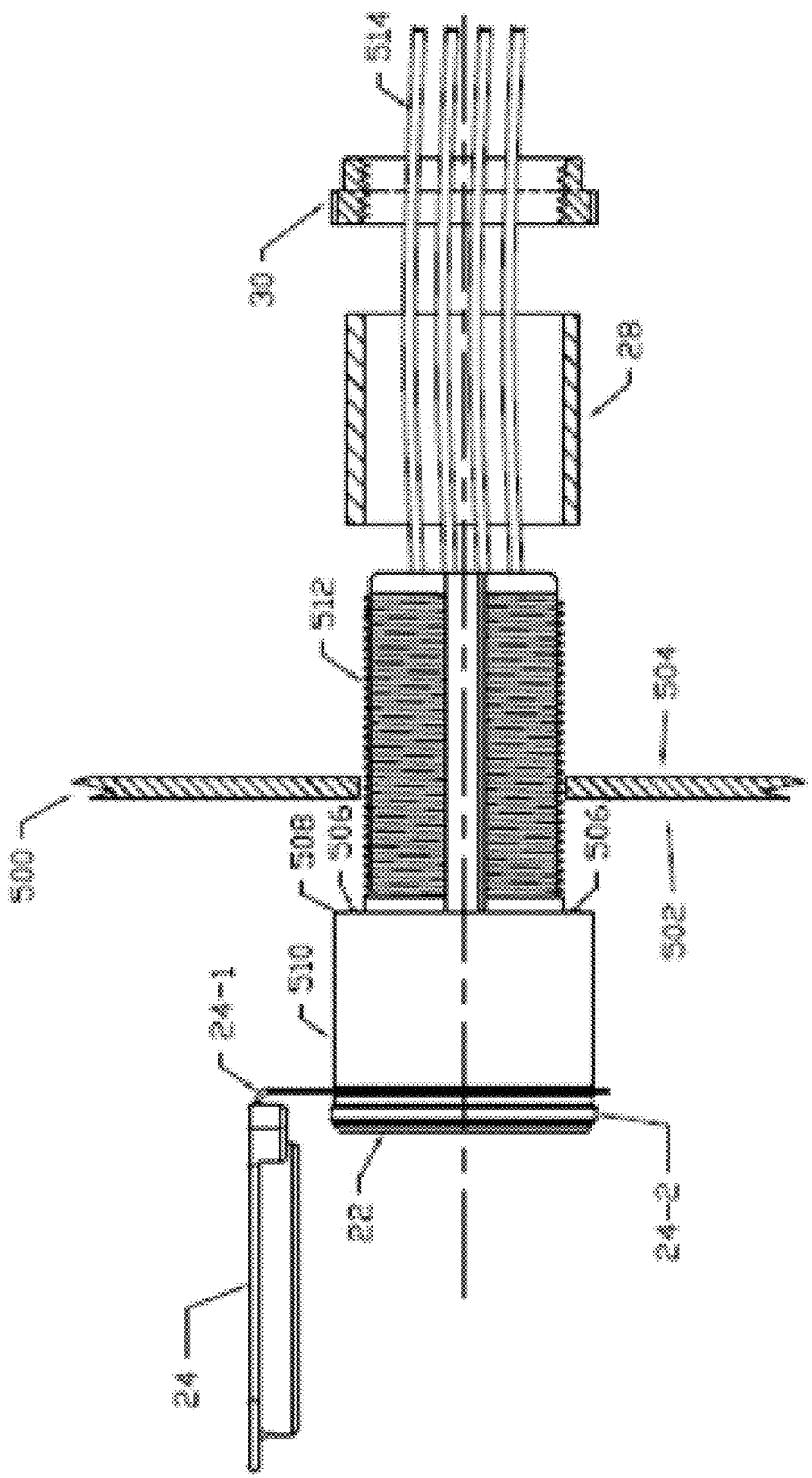
FIG. 5 illustrates an exploded top view of the compact test point device, in accordance with one or more features described herein.

FIG. 5 illustrates an exploded top view of the compact test point device 200, in accordance with one or more features described herein. The compact test point device 200, including the interface 20 comprising multiple external measurement sockets 22, is shown as being inserted through a front plate 500 (e.g., of an electrical box or the like), the front plate having a front side 502 and a rear side 504. A cover 24 is coupled to the device via a hinge 24-1 or the like. An O-ring 506 is shown in cross-section, and is seated in a receiving groove (not visible in FIG. 5) on a rear surface 508 of a display portion 510 of the test point device 200. The spacing sleeve 28 slides over a threaded portion 512 of the test point device 200 to mate against the rear side 504 of the front plate 500. The nut 30 screws onto the threaded portion 512 to secure the test point device against the front plate, positioned between the spacing sleeve 28 and the rear side 504 of the display portion 510. In one embodiment, the nut is e.g., a 30 mm hex nut, without being limited thereto. A plurality of wires 514 (e.g., one for each external measurement socket 22 according to one embodiment) are also shown extending from the rear of the test point device 200 and through the spacing sleeve 28 and the nut 30. Also provided is a sealing member 24-2 (an O-ring or quad-ring or other suitable means) that provides a friction fitting aspect when the cover 24 is in the closed position to protect the device from the elements.

Figure 6:
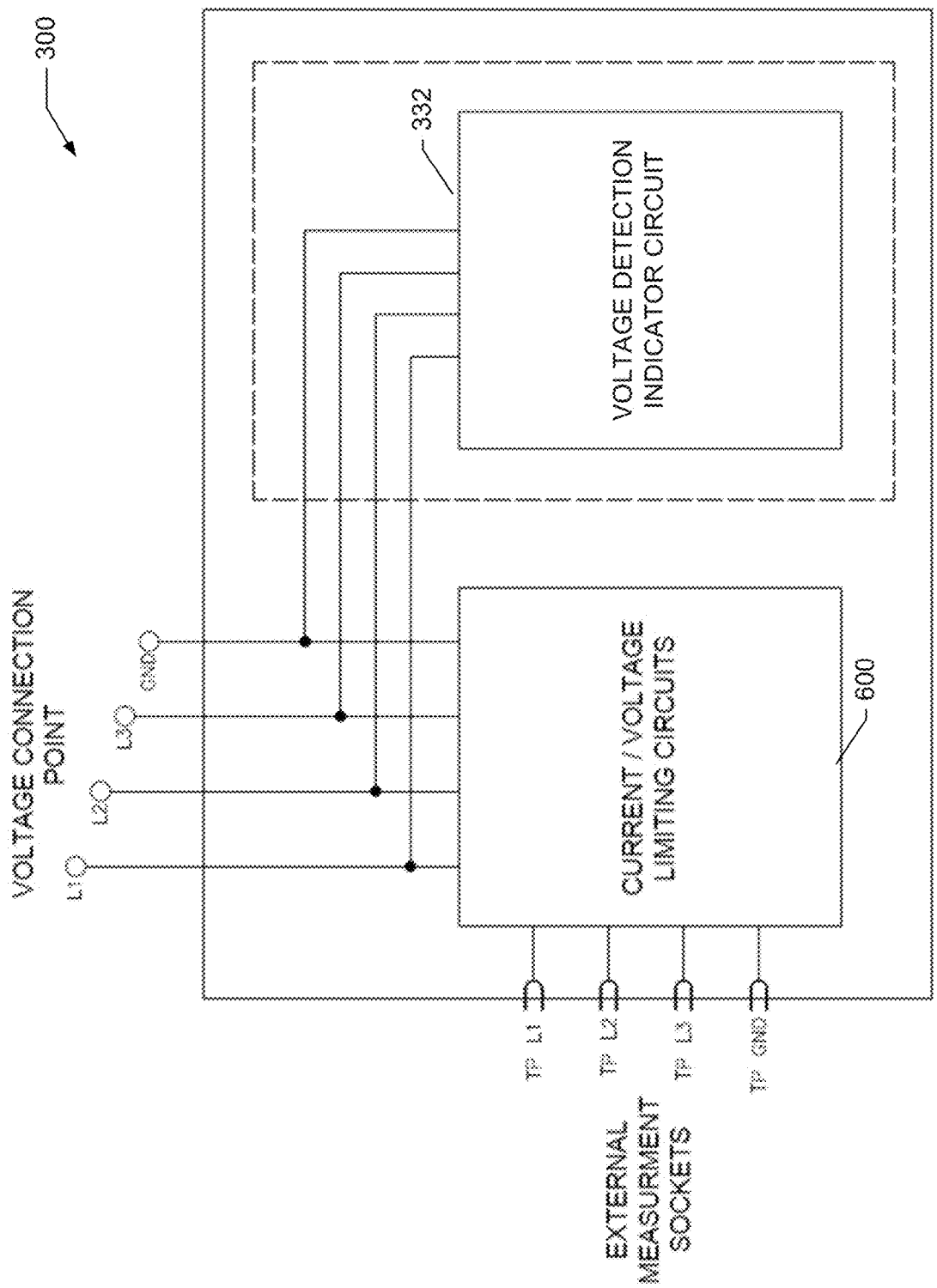
FIG. 6 shows a generalize illustration of the safety circuitry, comprising the voltage detection indicator circuitry and one or more current/voltage limiting circuits (CVLC).

FIG. 6 shows a generalize illustration of the safety circuitry 300, comprising the voltage detection indicator circuitry 332 and one or more current/voltage limiting circuits (CVLC) 600. The CVLC 600 may comprise the circuitry of FIG. 4 (i.e., resistor banks 304, 306) or may comprise the circuitry described below with regard to FIGS. 7-9.

Figure 7:
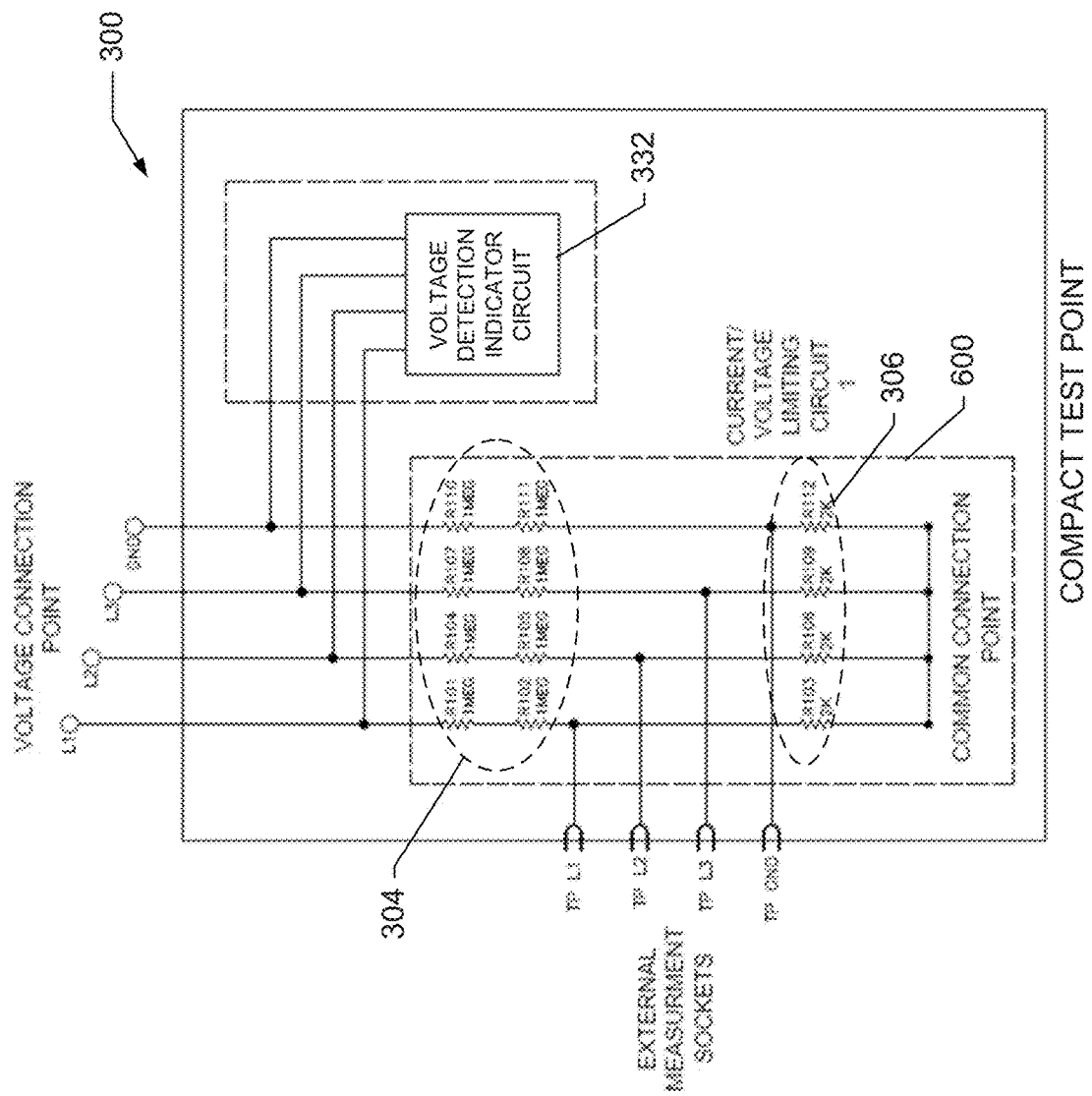
FIG. 7 illustrates an example of the safety circuitry in which a CLVC comprises the resistor banks of FIG. 4, in accordance with various aspects described herein.

FIG. 7 illustrates an example of the safety circuitry 300 in which a CLVC 600 comprises the resistor banks 304, 306 of FIG. 4, in accordance with various aspects described herein THE CLVC is coupled to the voltage detection circuit 332 as shown.

Figure 8:
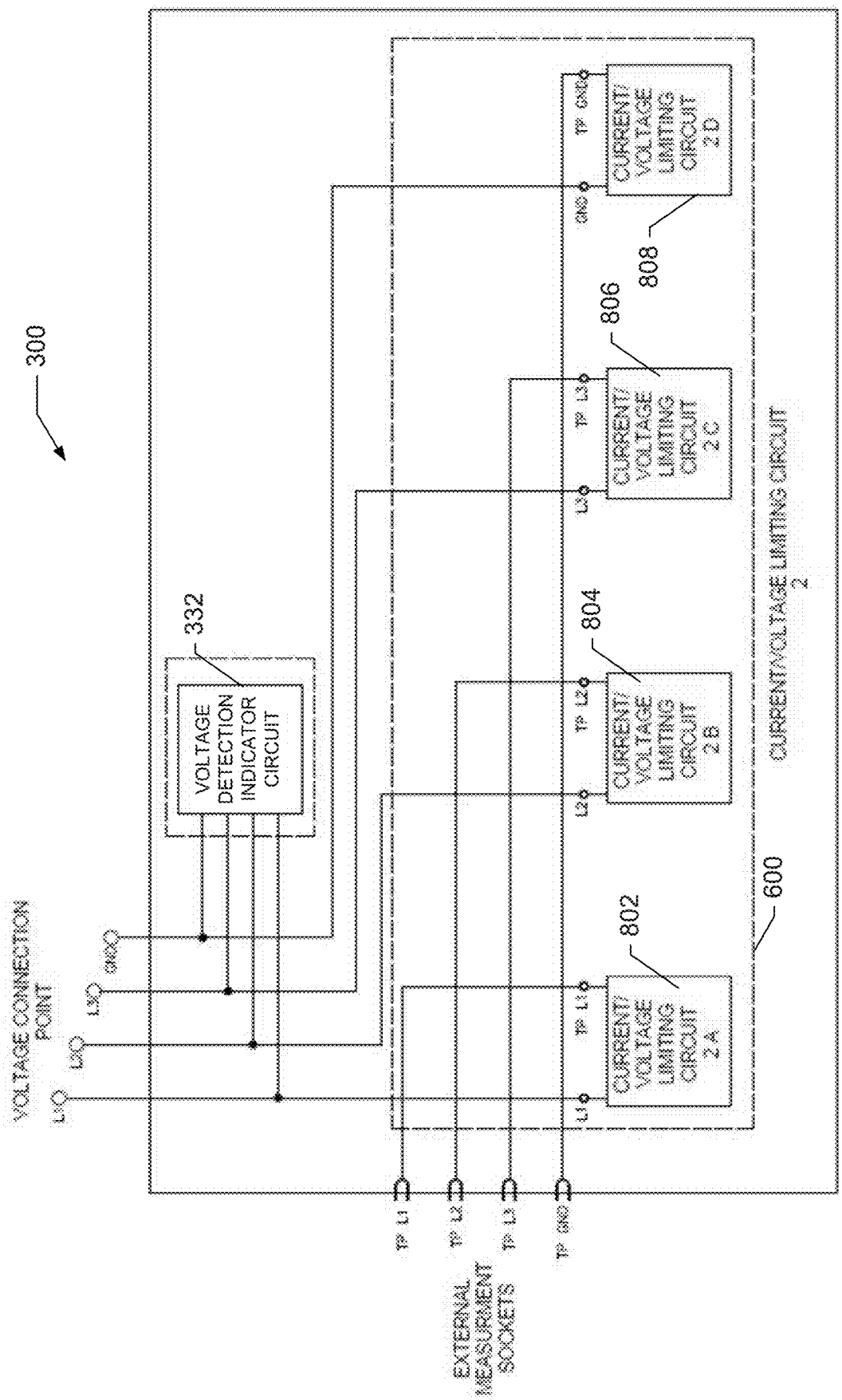
FIG. 8 illustrates an example of the safety circuitry in which a CLVC comprises a plurality of CVLC sub-circuits, in accordance with various aspects described herein.

FIG. 8 illustrates an example of the safety circuitry 300 in which a CLVC 600 comprises a plurality of CVLC sub-circuits 802, 804, 806, 808, in accordance with various aspects described herein The sub-circuits are also identified as sub-circuits 2A, 2B, 2C, and 2D. THE CLVC is coupled to the voltage detection circuit 332 as shown.

Figure 9:
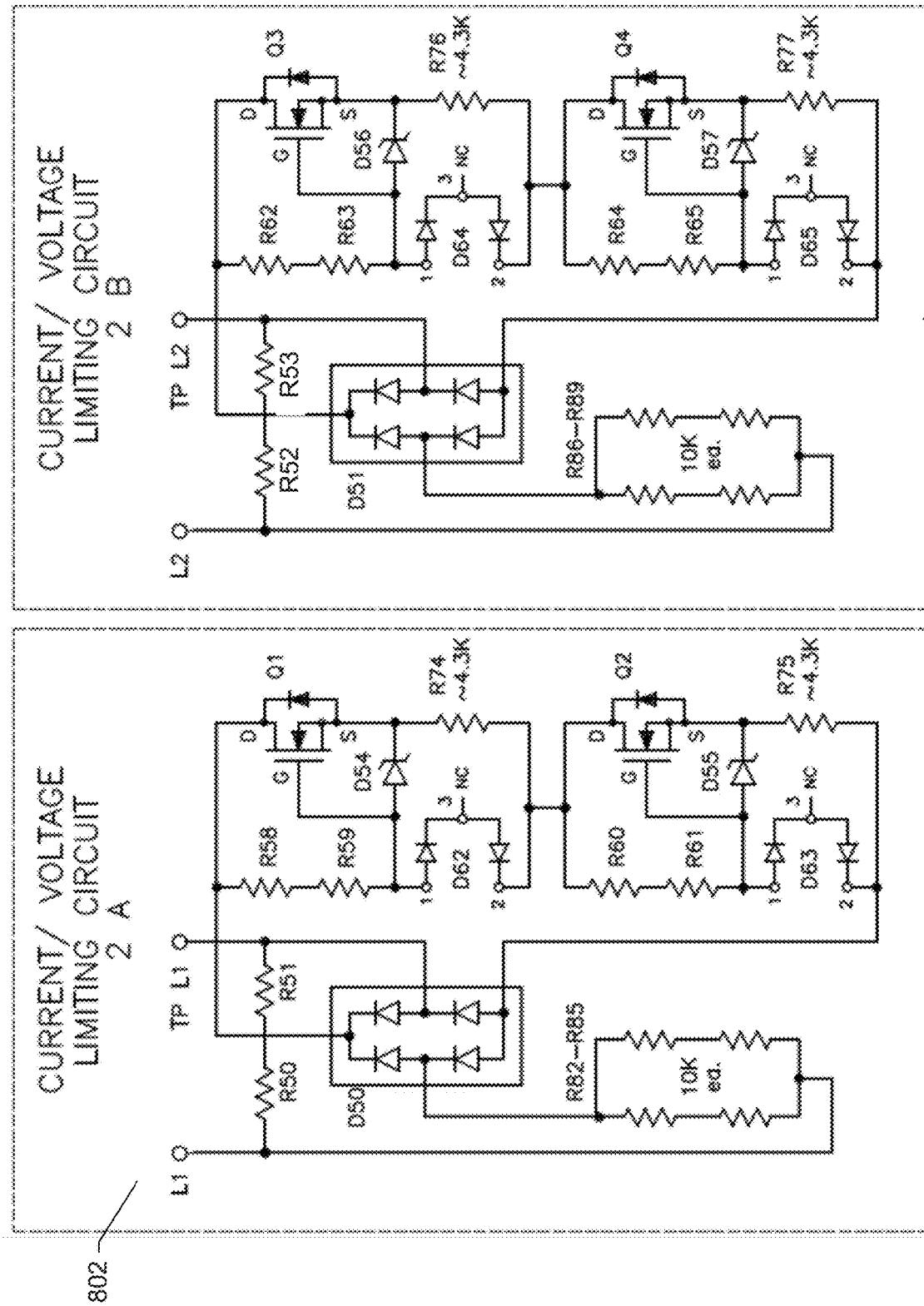
FIG. 9 illustrates two of the CLVC sub-circuits and for illustrative purposes.

FIG. 9 illustrates two of the CLVC sub-circuits 802 and 804 for illustrative purposes. It will be understood that sub-circuits 806 and 808 comprise similar or identical circuitry. However, only sub-circuits 802 and 804 are illustrated for purposes of brevity and due to space constraints.

Single phase AC is used as a basic example explanation, the invention principles applies for 3 phase (delta or wye), or DC. There are two main modes of operation, one with a multimeter connected correctly to measure voltage at the external measurement sockets. The second is a possible failure mode where the external measurement sockets are shorted together via an improperly configured or connected multimeter that has been set to read amps or the like (e.g., instead of voltage) causing a low resistance across any two or more external measurement sockets.

For the first mode of operation, MOSFETs Q1, Q2, Q3, and Q4 are ON, with 0V control voltage and 0V Vgs. In this embodiment, the current flows in from the L1 Connection, branching into two separate paths. In path 1, current flows through R50 and R51 and out to external measurement socket of TP L1. Path 2 flows through R82-R85 to the input of the full wave bridge rectifier D50. From there, current flows to parallel paths of R58 and to the drain connection of Q1. From there, current flows from R58 to R59 through the parallel paths of D62, D54, to the gate of Q1. The current flows in from the drain of Q1 and out to source, with low level gate voltage applied, into R74. The current then flows from the parallel connection of D62 and R74 to the parallel connections of R60 and Q2. From there, current flows from of R60 to R61 through the parallel paths of D63, D55, to the gate of Q2. The current flows in from the drain of Q2 and out to source, with low level gate voltage applied, into R75. The current then flows from the parallel connection of D63 and R75 to the negative side of the bridge of D50, and then out of D50 to the external sockets of TP L1.

With an electrical path from TP L1 to TP L2, current then flows in two paths through R53 to R52 and out to L2. In path 2, current flows into full wave bridge rectifier of D51. From there, current flows to parallel paths of R62 and to the drain connection of Q3. From there, current flows from R6 to R63 through the parallel paths of D64, D56, to the gate of Q3. The current flows in from the drain of Q3 and out to source, with low level gate voltage applied, into R76. The current then flows from parallel connection of D64 and R76 to the parallel connections of R64 and Q4. From there current flows from R64 to R65 through the parallel paths of D65, D57, to the gate of Q4. The current then flows in from the drain of Q4 and out to source, with low level gate voltage applied, into R77. The current then flows from the parallel connection of D65 and R77 to the negative side of the bridge of D51, and then out of D51 to the series and parallel combinations of R86-R89 out to L2.

The foregoing description applies to CLVC sub-circuits 2C and 2D (not shown in FIG. 9 due to space constraints, with and electrical path from TP L2 to TP L3 and from TP L3 to TP GND.

For the second mode of operation, the MOSFETs Q1, Q2, Q3, and Q4 have a negative (–)Vgs, sufficient to start regulating the current flow from the drain to source due to lower resistance between the TP L1 and TP L2 terminals. The negative voltage initiating regulation by (–) Vgs starts with a rising current from MOSFET drain to source causing voltage drop in current sense resistors R74, R75. This causes the MOSFETs to turn OFF and limits the current flow to flowing through the R58-R65 resistors, which are high resistance and therefore still allow for some current to flow, but not enough to cause a shorting condition between the L1 and L2 connections. This current limiting feature is employed to prevent overheating at higher line voltages and in particular the maximum ratings of, e.g., 750 Vac or 1000V DC.

Each phase connection circuit is identical, which allows for a path between any two wire connections 330 and the external measurement sockets.

A description of the circuit improvements in one of the identical current limiting branches (e.g., CLVC sub-circuit 2A, 802) is provided below. Resistors R50 and R51 are used to reduce the D50 rectifier diode voltage, dropping it to lower levels such as, e.g., less then 100V, to reduce voltage losses. R50 and R51 also add redundancy if D50 or MOSFETS Q1, Q2 opens. Resistors R74 and R75 values can be minimized for minimal voltage drop or loss, yet are precise enough for accurate current limiting. Diode D62 voltage drop adds to D54 Zener voltage, and this net voltage compensates the Vgs to facilitate correction or compensating for temperature variations to provide level current limiting over the operating temperature. Resistors R60 and R61 provide a voltage drop for D63 diodes.

As Vgs increases, the negative voltage across Vgs of Q1 and Q2 reach a turn off point which initiates the beginning of current limiting. Diode D54 and D55 forward voltage, (e.g., approximately 0.7V) protects Vgs maximum positive voltage.

Figure 10:
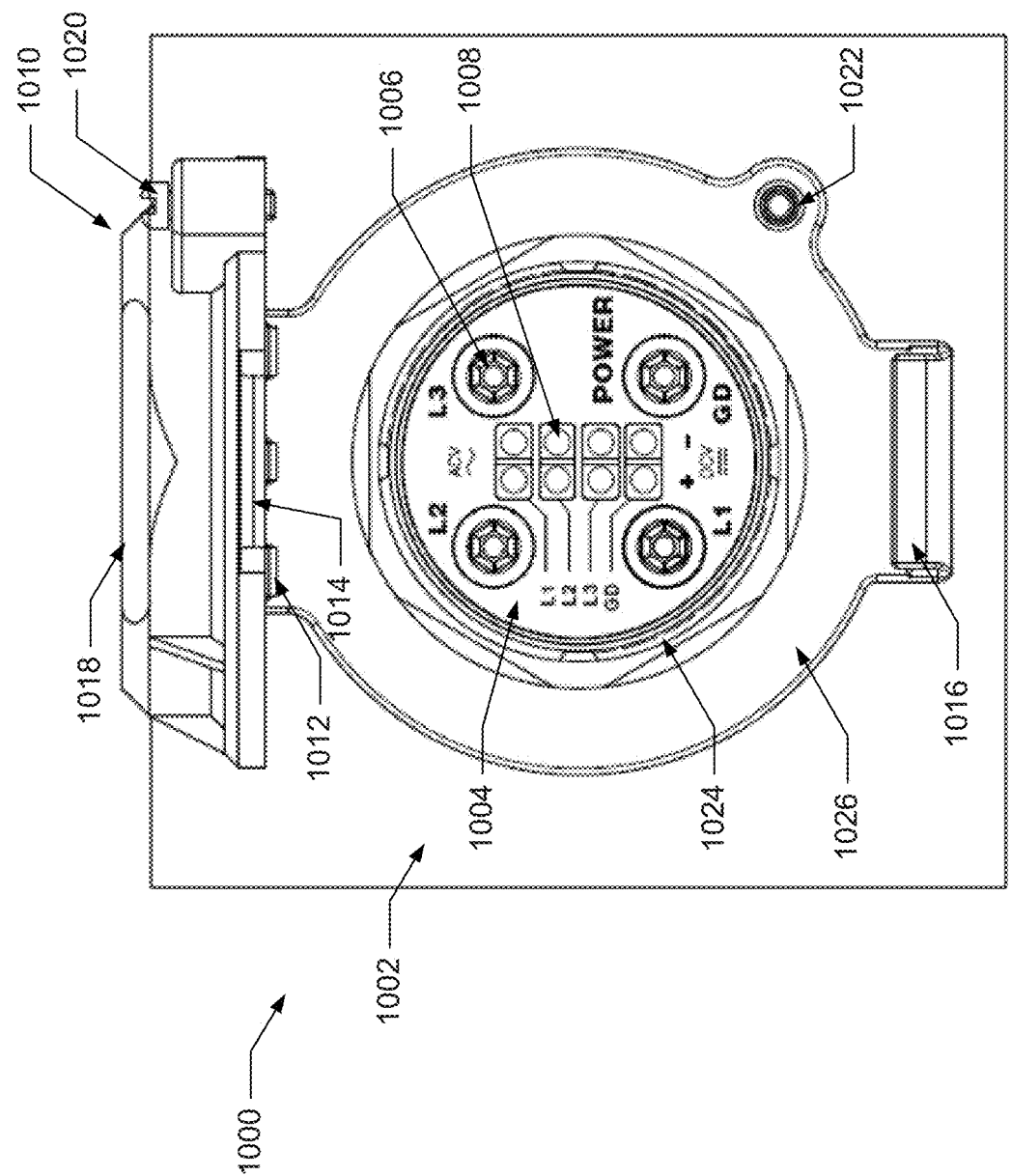
FIG. 10 illustrates a front view of a compact test point device, coupled to a front plate of an electrical enclosure, in accordance with various features described herein.

FIG. 10 illustrates a front view of a compact test point device 1000, coupled to a front plate 1002 of an electrical enclosure, in accordance with various features described herein. The device comprises an interface 1004 similar to the interface described in FIG. 4, and a plurality of test point (TP) measuring sockets into which a technician can insert multimeter probes to test a monitored circuit to which the device 1000 is coupled. The interface also comprises a plurality of LEDs 1008 that provide visible indications related to the status of each monitored line (L1, L2, L3, GND). A cover 1010 is provided, which is coupled to the device and/or the front plate 1002 by a hinge 1012 or other means. The cover comprises a latching tab 1014 that is configured to mate with a latch receiver 1016 to secure the cover in place when in a closed position. The cover also comprises a pull tab 1018 that can be manipulated by a technician to pull the cover open for testing the monitored circuit. For added security, a mechanical fastener 1020 is provided on the cover, which mates with a fastener receiver 1022 to secure the cover in a closed position. An O-ring 1024 or other sealing means is also provided on the perimeter of the interface to protect the interface from the elements.

In one embodiment, the cover and/or the hinge is attached to the test point device via a removable front protection cover ring 1026.

Figure 11:
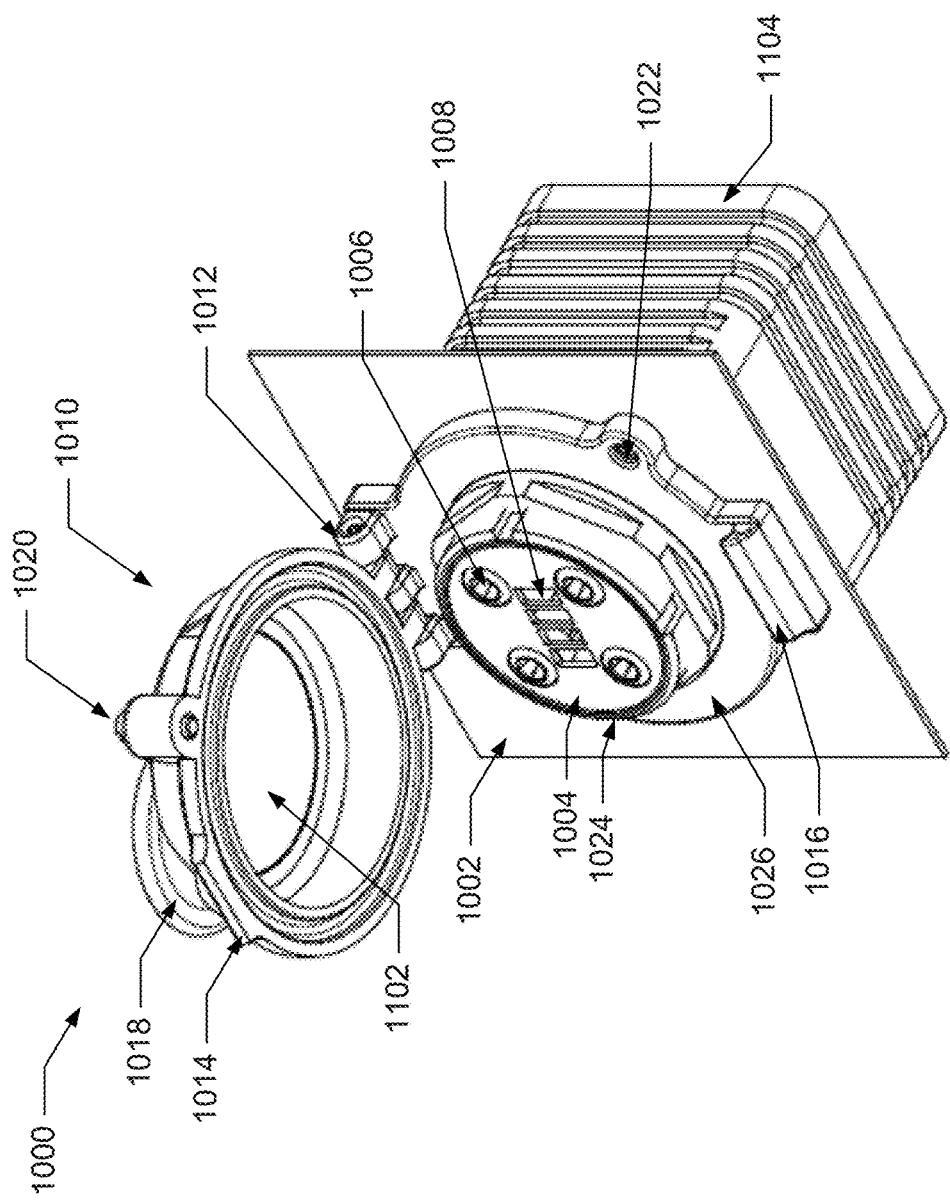
FIG. 11 illustrates a lower perspective view of the compact test point device, which is coupled to the front plate of an electrical enclosure, in accordance with various features described herein.

FIG. 11 illustrates a lower perspective view of the compact test point device 1000, which is coupled to the front plate 1002 of an electrical enclosure, in accordance with various features described herein. The device comprises an interface 1004 similar to the interface described in FIG. 10, and a plurality of test point (TP) measuring sockets 1006 into which a technician can insert multimeter probes to test a monitored circuit to which the device 1000 is coupled. The interface also comprises a plurality of LEDs 1008 that provide visible indications related to the status of each monitored line (L1, L2, L3, GND). A cover 1010 is provided, which is coupled to the device and/or the front plate by a hinge 1012 or other means. The cover comprises a latching tab 1014 that is configured to mate with a latch receiver 1016 to secure the cover in place when in a closed position. The cover also comprises a pull tab 1018 that can be manipulated by a technician to pull the cover open for testing the monitored circuit. For added security, a mechanical fastener 1020 is provided on the cover, which mates with a fastener receiver 1022 to secure the cover in a closed position. An O-ring 1024 or other sealing means is also provided on the perimeter of the interface to protect the interface from the elements. In another embodiment, the O-ring is located inside the cover and seats against the interface or the front panel. The cover further comprises a clear or transparent window or panel 1102 through which the LEDS can be seen while the cover is in a closed position. Also shown is a housing 1104 for the device, which mounts against a back surface of the front panel. In one embodiment, the cover and/or the hinge is attached to the test point device via a removable front protection cover ring 1026.

Figure 12:
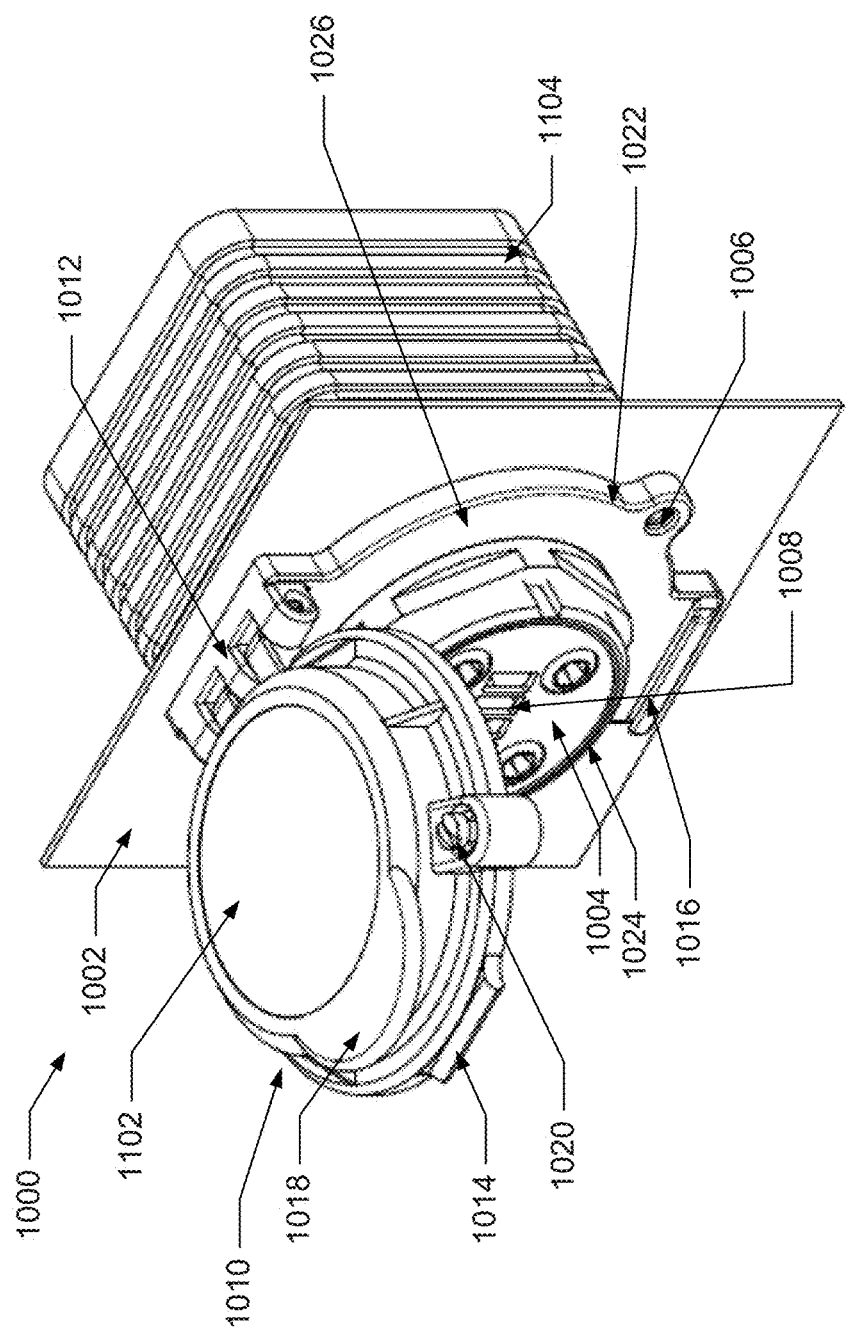
FIG. 12 illustrates an upper perspective view of the compact test point device, which is coupled to the front plate of an electrical enclosure, in accordance with various features described herein.

FIG. 12 illustrates an upper perspective view of the compact test point device 1000, which is coupled to the front plate 1002 of an electrical enclosure, in accordance with various features described herein. The device comprises an interface 1004 similar to the interface described in FIG. 10, and a plurality of test point (TP) measuring sockets 1006 into which a technician can insert multimeter probes to test a monitored circuit to which the device 1000 is coupled. The interface also comprises a plurality of LEDs 1008 that provide visible indications related to the status of each monitored line (L1, L2, L3, GND). A cover 1010 is provided, which is coupled to the device and/or the front plate by a hinge 1012 or other means. The cover comprises a latching tab 1014 that is configured to mate with a latch receiver 1016 to secure the cover in place when in a closed position. The cover also comprises a pull tab 1018 that can be manipulated by a technician to pull the cover open for testing the monitored circuit. For added security, a mechanical fastener 1020 is provided on the cover, which mates with a fastener receiver 1022 to secure the cover in a closed position. An O-ring 1024 or other sealing means is also provided on the perimeter of the interface to protect the interface from the elements. The cover further comprises a clear or transparent window or panel 1102 through which the LEDs can be seen while the cover is in a closed position. Also shown is a housing 1104 for the device, which mounts against a back surface of the front panel.

In one embodiment, the cover and/or the hinge is attached to the test point device via a removable front protection cover ring 1026.

Figure 13:
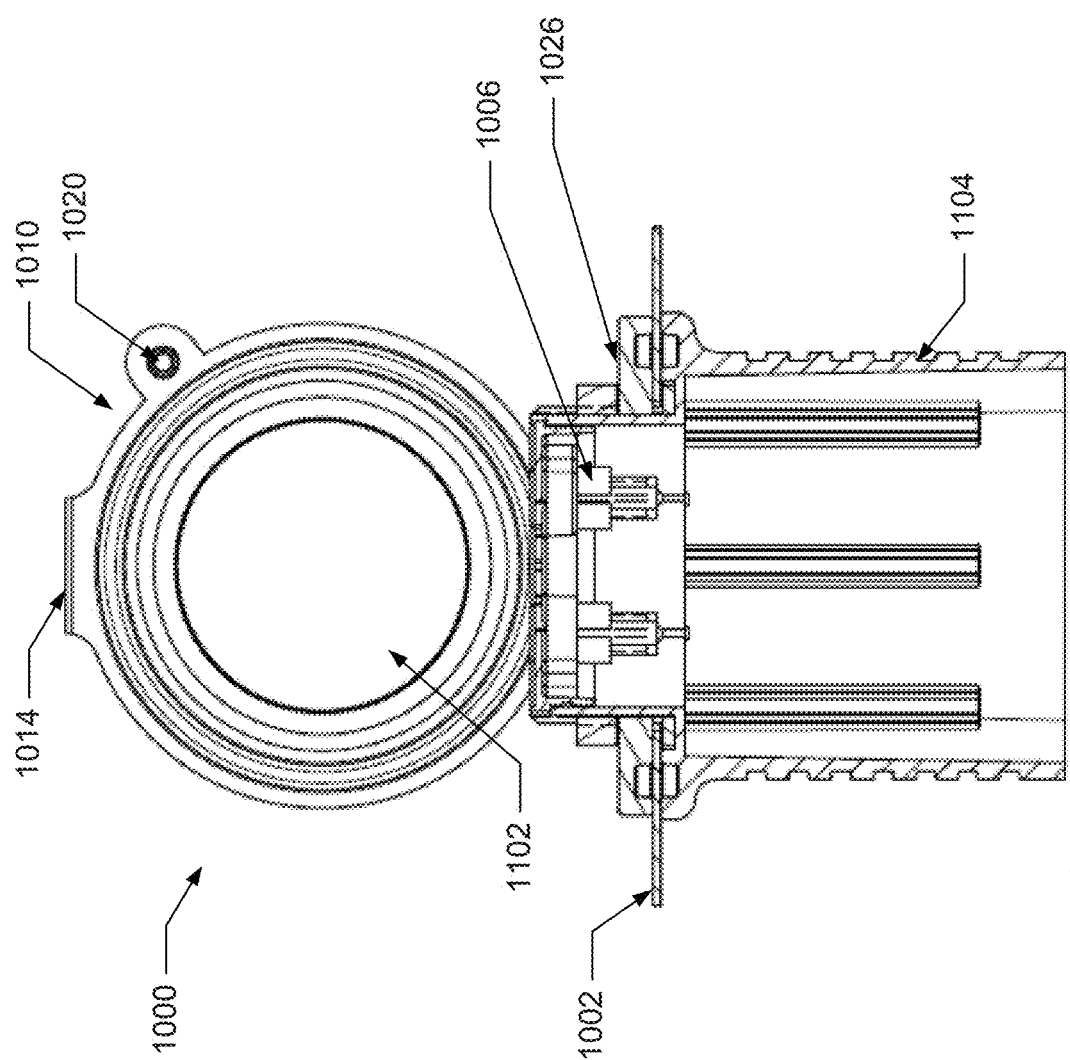
FIG. 13 illustrates a bottom cutaway view of the compact test point device, which is coupled to the front plate of an electrical enclosure, in accordance with various features described herein.

FIG. 13 illustrates a bottom cutaway view of the compact test point device 1000, which is coupled to the front plate 1002 of an electrical enclosure, in accordance with various features described herein. Also visible in this view are a plurality of test point (TP) measuring sockets 1006 into which a technician can insert multimeter probes to test a monitored circuit to which the device 1000 is coupled. The cover 1010 is shown, which is coupled to the device and/or the front plate by a hinge (not visible in FIG. 13) or other means. The cover comprises a latching tab 1014 that is configured to mate with a latch receiver 1016 to secure the cover in place when in a closed position. The cover also comprises a pull tab (not shown) that can be manipulated by a technician to pull the cover open for testing the monitored circuit. For added security, a mechanical fastener 1020 is provided on the cover, which mates with a fastener receiver 1022 to secure the cover in a closed position. The cover further comprises a clear or transparent window or panel 1102 through which the LEDs can be seen while the cover is in a closed position. Also shown is a housing 1104 for the device, which mounts against a back surface of the front panel.

FIG. 14 illustrates a bottom view of the compact test point device 1000, which is coupled to the front plate 1002 of an electrical enclosure, in accordance with various features described herein. The cover 1010 is shown, which is coupled to the device and/or the front plate by a hinge (not visible in FIG. 14) or other means. The cover comprises a latching tab 1014 that is configured to mate with a latch receiver 1016 to secure the cover in place when in a closed position. The cover also comprises a pull tab (not shown) that can be manipulated by a technician to pull the cover open for testing the monitored circuit. For added security, a mechanical fastener 1020 is provided on the cover, which mates with a fastener receiver 1022 to secure the cover in a closed position. The cover further comprises a clear or transparent window or panel 1102 through which the LEDs can be seen while the cover is in a closed position. Also shown is a housing 1104 for the device, which mounts against a back surface of the front panel. In one embodiment, the cover and/or the hinge is attached to the test point device via a removable front protection cover ring 1026.

FIG. 15 illustrates a side view of the compact test point device 1000, which is coupled to the front plate 1002 of an electrical enclosure, in accordance with various features described herein. The device comprise an interface 1004 such as is described with regard to FIG. 10. The cover 1010 is shown, which is coupled to the device and/or the front plate by a hinge 1012 or other means. The cover comprises a latching tab 1014 that is configured to mate with a latch receiver 1016 to secure the cover in place when in a closed position. The cover also comprises a pull tab 1018 that can be manipulated by a technician to pull the cover open for testing the monitored circuit. For added security, a mechanical fastener 1020 is provided on the cover, which mates with a fastener receiver 1022 to secure the cover in a closed position. An O-ring or other sealing means is provided, which seals the cover against the interface to protect the interface from the elements. Also shown is a housing 1104 for the device, which mounts against a back surface of the front panel.

In this manner, the herein described system facilitates providing a safe or safer non-shock voltage level to be provided for measurement by a technician despite a high unsafe circuit voltage across the measured circuit.

The claimed innovation has been described with reference to the various embodiments. Modifications and alterations will occur to others upon reading and understanding the preceding detailed description. It is intended that the embodiments described herein be construed as including all such modifications and alterations insofar as they come within the scope of the appended claims or the equivalents thereof.

The invention claimed is:

1. A system that facilitates providing an environmentally secured voltage testing interface comprising:
   a compact test point device that is mounted to a front panel of an electrical enclosure box and comprises an interface comprising a plurality of external measurement sockets configured to receive one or more probes for manual measurement of voltages;
   a plurality of LED indicators that indicate a status of one or more circuits coupled thereto and monitored thereby; and
   a current limiting circuit configured to provide power from any two combinations of current flow between L1, L2, L3, GND, TP L1, TP L2, TP L3 and TP Gnd where the input is one of AC single Phase, AC 3 Phase, and DC;
   wherein each external measurement socket is coupled to a voltage divider that is further coupled to each of a plurality of respective wires coupled to respective LED indicators.

2. The system according to claim 1, wherein the test point device further comprises a front protection cover protects the external measurement sockets from the environment.

3. The system according to claim 2, wherein the front protection cover is attached to the front panel.

4. The system according to claim 3, wherein the front protection cover is attached to the front panel with a hinge.

5. The system according to claim 2, wherein the front protection cover is attached to the interface of test point device.

6. The system according to claim 1, further comprising an O-ring seal positioned between the front side of the front panel and a recess on the test point device that receives the O-ring, wherein the O-ring securely seals the test point device against the front side of the front panel.

7. The system according to claim 1, further comprising a spacing sleeve that presses against an outside of a rear panel of the electrical enclosure box, and a nut that secures the test point device in the electrical enclosure upon tightening.

8. The system according to claim 1, wherein the external measurement sockets include four sockets.

9. The system according to claim 8, wherein the 4 sockets are coupled via respective voltage dividers to four measured lines, L1, L2, L3, and GND.

10. The system according to claim 9, lines L1, L2, L3, and GND are further coupled to corresponding LED indicators for lines L1, L2, L3, and GND on the voltage indicator.

11. The system according to claim 9, wherein the voltage dividers comprise a plurality of resistors that provide a consistent voltage dropping ratio regardless of whether AC or DC voltage is passed thereacross.

12. A system that facilitates providing an environmentally secured voltage testing interface comprising:
   a compact test point device that is mounted to a front panel of an electrical enclosure box and comprises an interface comprising a plurality of external measurement sockets configured to receive one or more probes for manual measurement of voltages; and
   a plurality of LED indicators that indicate a status of one or more circuits coupled thereto and monitored thereby;
   wherein each external measurement socket is coupled to a voltage divider that is further coupled to each of a plurality of respective wires coupled to respective LED indicators;
   a front protection cover protects the external measurement sockets from the environment; and a current limiting circuit configured to provide power from any two combinations of current flow between L1, L2, L3, GND, TP L1, TP L2, TP L3 and TP Gnd where the input is one of AC single Phase, AC 3 Phase, and DC.

13. System according to claim 12, wherein the front protection cover has an O-ring type seal that seals the measurement sockets and LEDs to the test point device.

14. System according to claim 12, wherein the front protection cover has a clear or transparent viewing window that permits viewing of the LED indicators and measurement sockets when the protection cover is closed.

15. System according to claim 14, wherein the measurement sockets are coupled via respective current limiting circuits to L1, L2, L3 and GND.

16. System according to claim 15, wherein the front protection cover comprises a latch protrusion that mates with a latch receiver positioned on the front panel to lock the front protection cover in a closed position.

17. System according to claim 12, wherein the front protection cover is secured by a mechanical fastener.

18. System according to claim 12, wherein the front protection cover is attached to the test point device via a removable front protection cover ring.

19. System according to claim 18, wherein the front protection cover presses against the front panel of the electrical enclosure box and further comprises a nut that secures the protection ring and test point device in place upon tightening.

20. A system that facilitates providing an environmentally secured voltage testing interface comprising:
- a compact test point device that is mounted to a front panel of an electrical enclosure box and comprises an interface comprising a plurality of external measurement sockets configured to receive one or more probes for manual measurement of voltages; and
- a plurality of LED indicators that indicate a status of one or more circuits coupled thereto and monitored thereby;
- wherein each external measurement socket is coupled to a voltage divider that is further coupled to each of a plurality of respective wires coupled to respective LED indicators;
- a front protection cover protects the external measurement sockets from the environment; and
- a current limiting circuit configured to limit current flowing from each input to a corresponding one of each external measurement socket, wherein each input is one of AC single Phase, AC 3 Phase, and DC.

* * * * *